United States Patent
Dastidar (10) Patent No.: US 9,432,033 B2
(45) Date of Patent: Aug. 30, 2016

(54) SYSTEM AND METHOD FOR ENABLING MAXIMUM PERFORMANCE OPERATION WITHIN AN EXTENDED AMBIENT TEMPERATURE RANGE

(71) Applicant: FREESCALE SEMICONDUCTOR, INC., Austin, TX (US)

(72) Inventor: Jaideep Dastidar, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 195 days.

(21) Appl. No.: 14/039,562

(22) Filed: Sep. 27, 2013

(65) Prior Publication Data

US 2015/0091622 A1   Apr. 2, 2015

(51) Int. Cl.
| | | |
|---|---|---|
| H03L 7/00 | (2006.01) | |
| H03L 7/16 | (2006.01) | |
| H03L 1/02 | (2006.01) | |

(52) U.S. Cl.
CPC .............. H03L 7/16 (2013.01); H03L 1/022 (2013.01)

(58) Field of Classification Search
CPC ................................. G05F 1/66; G06F 1/206
See application file for complete search history.

(56) References Cited

U.S. PATENT DOCUMENTS

| 7,256,610 | B1 * | 8/2007 | Balasubramanian .. | G01K 7/015 326/38 |
| 7,706,929 | B2 * | 4/2010 | Chiu ................... | G05D 23/1919 360/97.12 |
| 2005/0049729 | A1 * | 3/2005 | Culbert ................ | G06F 1/206 700/50 |
| 2005/0268133 | A1 * | 12/2005 | Beard ................ | G06F 1/206 713/323 |
| 2010/0070745 | A1 * | 3/2010 | Chiu ................ | G06F 1/26 713/2 |
| 2011/0296155 | A1 * | 12/2011 | Belady ................ | G06F 1/206 713/2 |
| 2012/0050000 | A1 * | 3/2012 | Melvin, Jr. ........ | G05B 23/0289 340/3.1 |
| 2012/0159200 | A1 * | 6/2012 | Ardron ............... | G06F 1/206 713/300 |
| 2015/0091622 | A1 * | 4/2015 | Dastidar ............. | G05F 1/66 327/143 |

FOREIGN PATENT DOCUMENTS

| JP | 07120903 A | 5/1995 |
| JP | 2007165527 A | 6/2007 |
| JP | 2011521386 A | 7/2011 |
| WO | WO2005017468 | 2/2005 |

\* cited by examiner

*Primary Examiner* — Ryan Jager (57) ABSTRACT

A system method of initializing operation of a semiconductor device including detecting de-assertion of an external reset signal while the semiconductor device in a reset state, monitoring a temperature level of the semiconductor device, and while the temperature level is below a predetermined minimum operating temperature level that allows the semiconductor device to operate at a maximum performance level, keeping the semiconductor device in the reset state and asserting at least one operating parameter on the semiconductor device at an elevated level to generate heat on the semiconductor device, and releasing the reset condition when the temperature level is at least the predetermined minimum operating temperature level. The operating parameter may be clock frequency or supply voltage level or a combination of both. Different elevated clock frequencies and/or different minimum operating temperature levels are contemplated. Additionally turning off an external cooling system during the heating process is contemplated.

13 Claims, 5 Drawing Sheets

SYSTEM AND METHOD FOR ENABLING MAXIMUM PERFORMANCE OPERATION WITHIN AN EXTENDED AMBIENT TEMPERATURE RANGE

BACKGROUND OF THE INVENTION

1. Field of the Invention

This disclosure relates generally to system operating constraints within an ambient temperature range, and more specifically, to a system and method for enabling maximum performance operation within an extended ambient temperature range including extremely low ambient temperatures.

2. Description of the Related Art

Conventional manufacturing methods of semiconductor devices often dictated that different versions of a semiconductor device be designed and manufactured according to different operating specifications. For example, commercial grade parts were designed to meet commercial standards, whereas military grade parts were designed to meet more stringent military standards to enable operation during harsh conditions or in harsher environments. Commercial grade parts, for example, were specified to operate at a maximum performance level only down to a relatively modest temperature level, such as 0° C., whereas military grade parts were specified to operate at the maximum performance level within an extended ambient temperature range, such as down to −40° C.

Manufacturing multiple version of the same device to meet different specifications is inefficient and costly. Furthermore, many commercial customers have been requesting that commercial grade devices meet more rigid standards to enable operation under harsher operating conditions while operating within the same power envelope, such as an extended operating temperature range. For example, base stations of commercial wireless networks are often exposed to extreme weather conditions. Commercial airliners are continuously exposed to frigid temperatures at high altitudes. Whereas the power envelope is a function of the maximum frequency at the maximum temperature (e.g., 85° C.), the customer often has the expectation that the part operates at a maximum frequency and/or maximum performance level even when exposed to temperatures below the normal ambient temperature range. These conditions make it challenging to acquire sufficient yield of silicon that meets both ends of the operating corners.

External components, such as external heaters or heating pads or the like, were often provided to heat up electronic commercial devices to a predetermined minimum operating level so that the system could operate at maximum performance. Such external devices were costly, and in some cases, raised additional safety concerns. For example, a heater or heating pad used to heat up electronics on an airliner posed additional fire hazard risks.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present inventor has recognized that the maximum quoted frequency is often constrained by the ambient and/or operating temperature. In some cases, depending upon the process technology, the lower the ambient temperature, the more constrained the maximum operating frequency and corresponding performance. He has therefore developed a system and method to increase the operating temperature of a device out of a cold start to therefore legitimately claim maximum performance across the extended ambient temperature range. For example, he has developed a system and method to increase the operating temperature of a device out of a cold start to therefore legitimately claim maximum frequency and/or performance across the extended ambient temperature range. In this manner, even though the operating temperature range of the device may be less than the extended temperature range, maximum frequency and/or performance may be claimed within the extended ambient temperature range.

Figure 1:
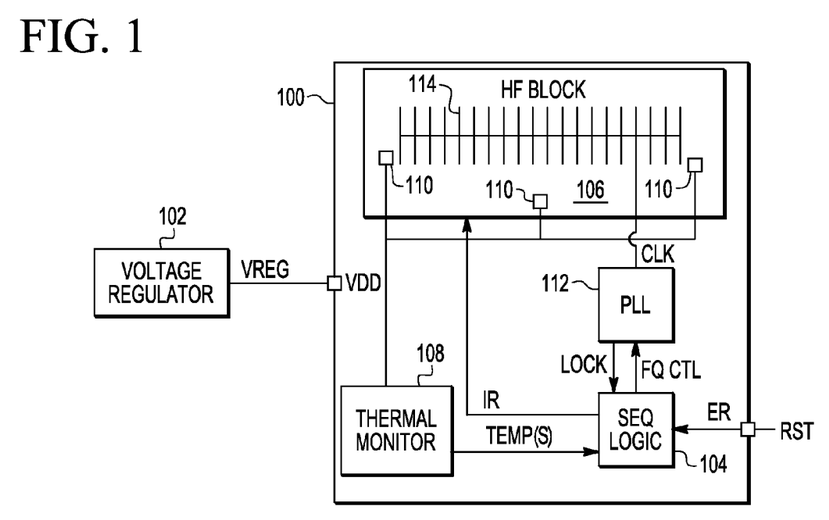
FIG. 1 is a simplified block diagram of a semiconductor device incorporating a cold start system and method for enabling maximum performance operation within an extended ambient temperature range according to one embodiment using clock frequency for heating the semiconductor device.

FIG. 1 is a simplified block diagram of a semiconductor device 100, such as an integrated circuit (IC) or semiconductor chip or die or the like, incorporating a cold start system and method for enabling maximum performance operation within an extended ambient temperature range according to one embodiment. The semiconductor device 100 may be implemented to perform any type of function, including processing functions such as including one or more processors, microcontrollers and/or microprocessors or the like. The semiconductor device 100 may be part of or incorporated within a system-on-chip (SOC) or as part of an embedded processing system or the like.

The semiconductor device 100 includes multiple input/output (I/O) interfaces, such as ports or pins or the like, for receiving external signals or voltages or the like. As shown, the semiconductor device 100 includes a VDD supply pin receiving a regulated supply voltage VREG from an external voltage regulator 102. The semiconductor device 100 further includes a reset pin or the like receiving an external reset signal RST, which is internally conveyed as an external reset (ER) signal to internal sequence (SEQ) logic 104. The RST signal may be considered an external activation signal when negated or de-asserted. The sequence logic is provided to perform power on reset (POR) functions as further described herein. The semiconductor device 100 may include many other subsystems and I/O interfaces that are not described herein as not necessary for a complete understanding of the present invention.

The semiconductor device 100 is generally held in a reset condition while the RST signal is asserted by an external system or device (not shown). VREG may first be established at a regulation level and then RST is negated or otherwise de-asserted to power up the semiconductor device 100 for operation. When RST is de-asserted, the sequence logic 104 is configured to control powering up the semiconductor device 100, including bringing up or enabling individual components and enabling clocks and the like. The semiconductor device 100 may, however, be located in an extreme or harsh environment with extreme temperatures, such as below 0° C. even down to a minimum temperature of an extended temperature range, such as negative 40° C. (−40° C.). During a cold startup of the semiconductor device 100, one or more portions may be below an operating temperature range thus otherwise inhibiting immediate startup.

The sequence logic 104 is part of infrastructure logic of the semiconductor device 100 which generally includes analog devices or the like or low frequency digital components. In this manner, the sequence logic 104 is capable of operating within the extended temperature range without performance limitations. In the illustrated embodiment, the semiconductor device 100 further includes at least one high frequency (HF) block 106. The sequence logic 104 asserts an internal reset signal (IR) to the HF block 106 to hold it in a reset condition upon POR (e.g., negation of RST) until conditions are suitable for allowing the HF block 106 to operate as further described herein. The HF block 106 represents one or more high frequency functional blocks of the semiconductor device 100, such as any one or more of processor cores, interconnects, memory caches, etc.

The HF block 106 may be able to operate with limited performance at the minimum temperature of the extended temperature range, such as at −40° C., but may not be able to operate at a predetermined maximum performance level. The performance of the HF block 106 is related to its frequency of operation, such that the higher the frequency, the higher the performance level. The HF block 106 is also associated with a minimum operating temperature for achieving its maximum performance level. In one embodiment, for example, the HF block 106 may be operated at a predetermined maximum frequency level to achieve maximum performance when its operating temperature is at or above a minimum operating temperature of 0° C. In a typical manufacturing process, many semiconductor die are unable to operate correctly at the maximum performance level when at the minimum temperature of the extended temperature range.

The semiconductor device 100 further includes a thermal monitor 108 that monitors the temperature level of the HF block 106. As shown, one or more temperature sensors 110 are distributed within the HF block 106 and coupled to the thermal monitor 108 for measuring and evaluating the temperature condition of the HF block 106. The temperature sensors 110 and the thermal monitor 108 are also capable of operating within the entire extended temperature range. In one embodiment, the thermal monitor 108 is configured to convert values (e.g., readings or signals or the like) provided by the temperature sensors 110 and to convert the values to one or more temperature values that are accurate within a predetermined error range.

In one embodiment, each temperature sensor value is converted into a corresponding TEMP value and one or more temperature values are generated and provided by the thermal monitor 108 via a signal TEMP(S) to the sequence logic 104. The sequence logic 104 may average multiple temperature values received from the thermal monitor 108 to calculate an average temperature value. An average temperature value may be suitable for certain implementations of the HF block 106. Alternatively, the sequence logic 104 determines the temperature condition of the HF block 106 based on a minimum one and/or a maximum one of the TEMP values. Determination of a minimum TEMP value and a maximum TEMP value allows detection of a "cold spot" and/or a "hot spot" that may otherwise inhibit successful operation of the HF block 106.

The thermal monitor 108 may incorporate calculation logic or the like. In this case, the thermal monitor 108 may be configured to average the values received from the temperature sensors 110 into an average temperature value which is provided to the sequence logic 104. Alternatively, the thermal monitor 108 may be configured to evaluate the temperature values and provide the TEMP(S) signal as one or more evaluation parameters indicative of the temperature condition of the HF block 106. For example, such evaluation parameters may include a TEMPLO value (average temperature or at least one temperature value is below the minimum operating temperature level), a TEMPHI value (average temperature or at least one temperature value is above a maximum operating temperature level), a TEMPOK value (average temperature or all of the temperature values are within an operating temperature range), etc.

The semiconductor device 100 further includes a phase-locked loop (PLL) block 112, which generates at least one clock signal CLK. The CLK signal is provided to a clock tree 114 that is distributed within the HF block 106. In the illustrated embodiment, the sequence logic 104 provides one or more frequency control signals FQ CTL to the PLL 112 for enabling the PLL 112 and/or to set or program the frequency of the CLK signal. In one embodiment, the sequence logic 104 may program the PLL 112 with a multiplier or the like for establishing the frequency of CLK. When the frequency of CLK stabilizes at its programmed frequency, the PLL 112 asserts a LOCK signal to the sequence logic 104.

Figure 2:
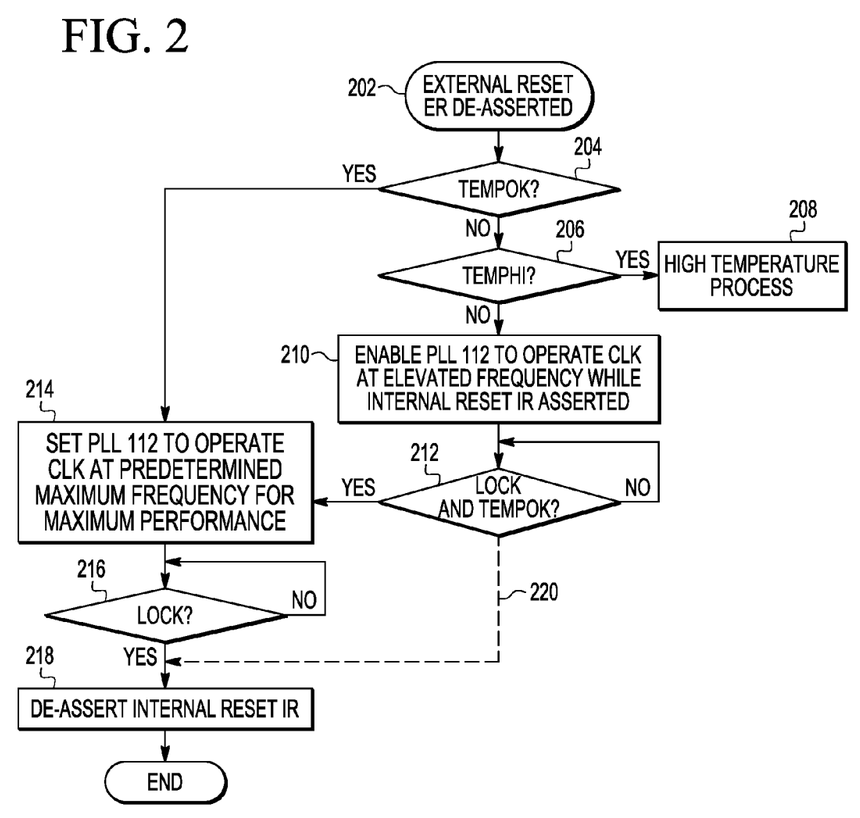
FIG. 2 is a flowchart diagram illustrating operation of the sequence logic of the semiconductor device of FIG. 1 according to one embodiment.

FIG. 2 is a flowchart diagram illustrating operation of the sequence logic 104 of the semiconductor device 100 according to one embodiment. At a first block 202, the external reset signal ER is de-asserted (indicative of RST) so that it is desired to enable the semiconductor device 100 for operation. The internal reset signal IR remains asserted until de-asserted by the sequence logic 104 as further described herein. At next block 204, it is queried whether the temperature condition of the semiconductor device 100 is suitable for operation. In the illustrated embodiment, the temperature of analog blocks and/or low frequency functional blocks (e.g., thermal monitors, sequence logic, etc.) need not be monitored as they are configured to operate in the extended operating range. Instead, the temperature condition of the HF block 106 is monitored by the thermal device 108. A value TEMPOK is true when the HF block 106 is within a normal operating temperature range for maximum performance operation, but is otherwise false.

As described herein, the normal operating temperature range is narrower than the extended temperature range. It is desired, nonetheless, to operate the semiconductor device 100 at a maximum performance level when the ambient temperature of the semiconductor device 100 is within the extended temperature range. In one embodiment, for example, the minimum temperature of the normal operating temperature range is 0° C. whereas the minimum temperature of the extended temperature range is −40° C.

If TEMPOK is false such that the TEMP(S) signal indicates that the temperature condition of the HF block 106 is outside the normal operating temperature range, operation advances to a block 206 in which it is queried whether the temperature is too high. As shown, a value TEMPHI is true the temperature is too high so that it may be too hot to enable the HF block 106. If so, operation proceeds to a block 208 to perform a high temperature process. For example, one or more error conditions may be asserted and/or an external cooling system 702 (FIG. 7) may be activated or its cooling operation increased (e.g., fan speed increased) to reduce the high temperature condition. Additional description of the high temperature process is not described as beyond the scope of the present disclosure.

If TEMPHI is also false as determined at block 206, operation advances to a block 210 in which the PLL 112 is enabled and/or otherwise programmed to operate CLK at an elevated frequency while IR remains asserted. In this case, the temperature is below the minimum level of the normal operating temperature range (and thus too low to enable operation). The term "elevated frequency" is defined to mean that the frequency of CLK is greater than a maximum frequency level at which the HF block 106 can correctly operate while below the normal operating temperature range. In other words, the HF block 106 either does not operate at all or will fail to operate properly at low temperature and high frequency.

Operating CLK at an elevated frequency level takes advantage of the resistive heating of the clock tree 114 to increase the temperature of the HF block 106. It is appreciated that silicon-based devices are able to operate at higher frequency levels when at higher temperature levels. Semiconductor processing technologies, including CMOS processing technologies, continue to advance to smaller device geometries, including 22 nanometer (nm), 20 nm, 14 nm, etc. As the geometries have decreased in size, leakage current has generally increased. Leakage current may account for a substantial percentage of power consumption, and the power level caused by leakage current is generally dissipated as heat. Clock trees generally incorporate a substantial number of transistor devices (e.g., NMOS and PMOS transistors and the like) that generate a significant level of static leakage current when activated or turned on and before being excited with a clock signal. When a clock signal is applied to the transistor devices of the clock tree, additional dynamic power is generated thereby producting additional heat energy. The dynamic heat generation increases with increasing frequency of the CLK signal applied to the clock tree.

In this manner, the CLK signal applied at an elevated frequency level to the clock tree 114 increases or otherwise maximizes heat generation of the HF block 106. The IR signal remains asserted so that the HF block 106 remains in a reset state so that there is no concern for functional failure. The elevated frequency reduces the amount of time for the temperature condition of the HF block 106 to reach or otherwise exceed the minimum temperature level of the normal operating temperature range. It is noted that even in a cold start condition in which the semiconductor device 100 has fallen to the minimum temperature level of the extended temperature range, the temperature of the HF block 106 may rise to the minimum temperature level of the normal operating temperature range in a matter of milliseconds (ms) while CLK is at the elevated frequency level.

In one embodiment, the elevated frequency level may be the same as a predetermined maximum frequency level of the CLK signal to achieve a predetermined maximum performance level for the normal operating temperature range. In addition or in the alternative, the elevated frequency level may be the maximum frequency level capable of being generated by the PLL 112. In general, it is desired to increase or otherwise maximize heat generation to reduce or otherwise minimize the amount of time for achieving the minimum temperature of the normal operating temperature range of the HF block 106.

Operation advances to block 212 in which it is queried whether the LOCK signal has been provided and whether the TEMPOK condition has been met. The LOCK signal indicates that the CLK has stabilized at its set or programmed frequency level. TEMPOK is true when the temperature level of the HF block 106 is within the normal operating temperature range. Operation loops at block 212 when either of these conditions is not met.

When LOCK and TEMPOK are both true, then operation proceeds to block 214 in which the PLL 112 is set or programmed to operate CLK at a predetermined maximum frequency for achieving maximum performance. As noted above, the elevated frequency may be higher than the maximum frequency that the HF block 106 is capable of operating, so that the frequency of CLK may be reduced at block 214. Operation then advances to block 216, and operation loops at block 216 while the PLL 112 stabilizes the new frequency of CLK. When LOCK is asserted by the PLL 112, operation advances to block 218 in which the sequence logic 112 de-asserts the internal reset signal IR to enable operation of the semiconductor device 100.

A dashed line 220 denotes an alternative configuration for when the elevated frequency level and the predetermined maximum frequency for maximum performance are the same. In this case, there is no need to adjust the PLL 112 once the normal operating temperature is achieved, so that blocks 214 and 216 may be bypassed. In this case, when LOCK and TEMPOK are both true, operation proceeds directly to block 218 to initiate operation of the semiconductor device 100. Furthermore, if TEMPOK is true at block 204, operation advances directly to block 213 to set the frequency at the desire operating level since preliminary heating is unnecessary.

Figure 3:
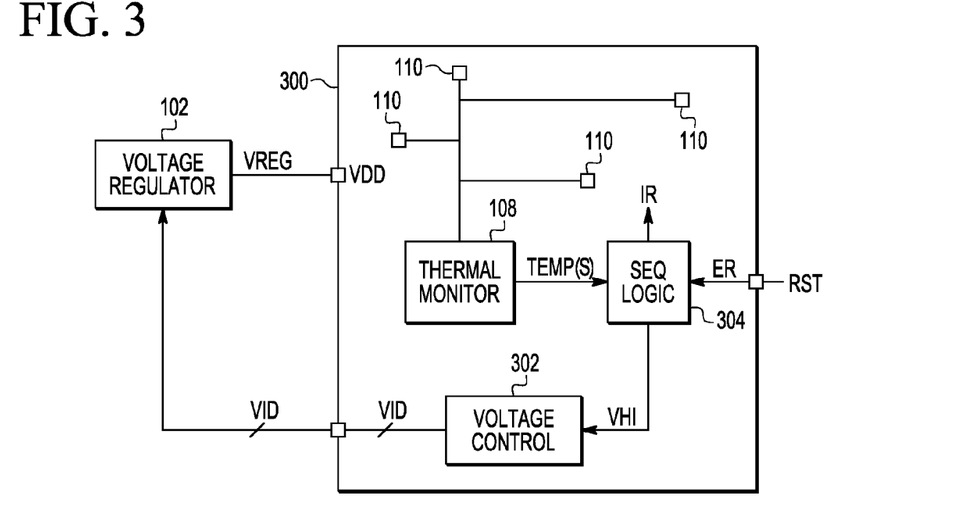
FIG. 3 is a simplified block diagram of a semiconductor device incorporating a cold start system and method for enabling maximum performance operation within an extended ambient temperature range according to one embodiment using elevated supply voltage for heating the semiconductor device.

FIG. 3 is a simplified block diagram of a semiconductor device 300 incorporating a cold start system and method for enabling maximum performance operation within an extended ambient temperature range according to one embodiment. The semiconductor device 300 may also be implemented to perform any type of function, including processing functions such as including one or more processors, microcontrollers and/or microprocessors or the like, and also may be part of or incorporated within a system-on-chip (SOC) or as part of an embedded processing system or the like. The semiconductor device 300 may include similar components as the semiconductor device 100. As shown, the semiconductor device 300 includes the thermal monitor 108 and one or more temperature sensors 110. The sequence logic 104 is replaced with similar sequence logic 304. The thermal monitor 108 provides the TEMP(S) signal to the sequence logic 304 in similar manner, and the sequence logic 304 controls the IR signal in similar manner.

The voltage regulator 102 is shown providing VREG to the VDD supply voltage input of the semiconductor device 300. Also, the external RST signal is provided to a reset input ER, which is provided to the sequence logic 304 in similar manner. The semiconductor device 300 further includes a voltage control block 302 providing a voltage identification (VID) value via an I/O pin to the voltage regulator 102 for programming or otherwise adjusting VREG. The VID value is a digital value including multiple bits for setting a voltage level for VREG. Furthermore, the sequence logic 304 asserts a voltage control override value VHI to the voltage control block 302.

The semiconductor device 300 may or may not include high frequency logic, such as the HF block 106. The IR signal operates to keep the semiconductor device 300 in a reset state, and may be provided to high frequency logic if provided. The temperature sensors 110 are distributed on the die of the semiconductor device 300 and may be included within high frequency logic, if provided. The temperature sensors 110 are coupled to the thermal monitor 108 and operate in substantially the same manner. In general, the semiconductor device 300 is unable to operate at a maximum performance level when the temperature is below the minimum temperature level of the normal operating temperature range in similar manner as the semiconductor device 100.

Figure 4:
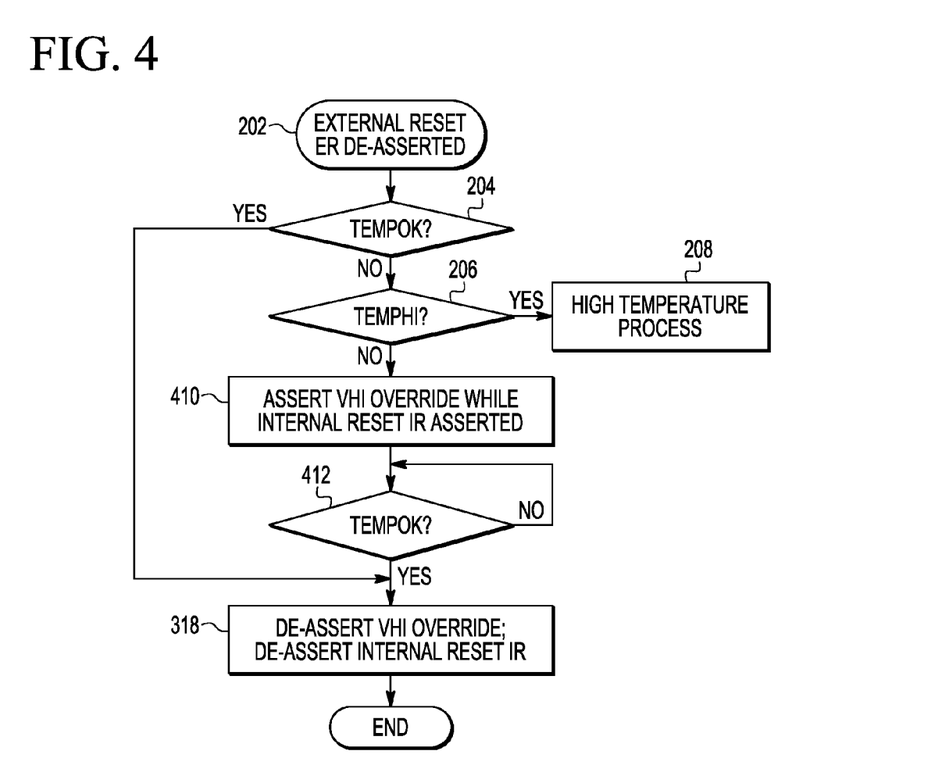
FIG. 4 is a flowchart diagram illustrating operation of the sequence logic of the semiconductor device of FIG. 3 according to one embodiment.

FIG. 4 is a flowchart diagram illustrating operation of the sequence logic 304 of the semiconductor device 300 according to one embodiment. Operational blocks 202, 204, 206 and 208 are included and are substantially the same and are not further described. When the temperature is too low as determined at block 206, operation advances to block 410 in which the sequence logic 304 asserts the VHI override while the internal reset signal IR is asserted. In this case, the voltage control block 302 asserts the VID value to command the voltage regulator 102 to increase VREG to a predetermined elevated voltage level. VHI may be considered as an override to override the normal operating voltage level of VREG during power up or reset during cold conditions.

The term "elevated voltage" is defined to mean that the voltage level of VREG is greater than the normal operating voltage level of the semiconductor device 300. The supply voltage may be increased as high as possible without being so high as to stress internal components or circuitry or otherwise to compromise components or cause damage. The elevated level of VREG is sufficient to increase or otherwise maximize heat generation caused by an increase in the supply voltage. It is noted that power level generation and/or dissipation is based on the relation $CV^2F$, where "C" denotes capacitance, "V" denotes voltage, and "F" denotes frequency. In this manner, even a 5% increase of the supply voltage, such as from 1 Volt (V) to about 1.05V causes about a 25% increase in power level consumption. A significant portion of the overall power level is dissipated as heat.

Operation then proceeds to block 412 in which the temperature condition of the semiconductor device 300 is monitored to determine when the minimum operating temperature is reached. While TEMPOK is false, operation loops at block 412. When TEMPOK is true, operation proceeds to block 318 in which the sequence logic 304 de-asserts the VHI override for a normal voltage level and de-asserts the IR signal to initiate operation of the semiconductor device 300. If TEMPOK is already true at block 204, operation directly proceeds to block 318 to initiate operation of the semiconductor device 300 without increasing the supply voltage level.

Figure 5:
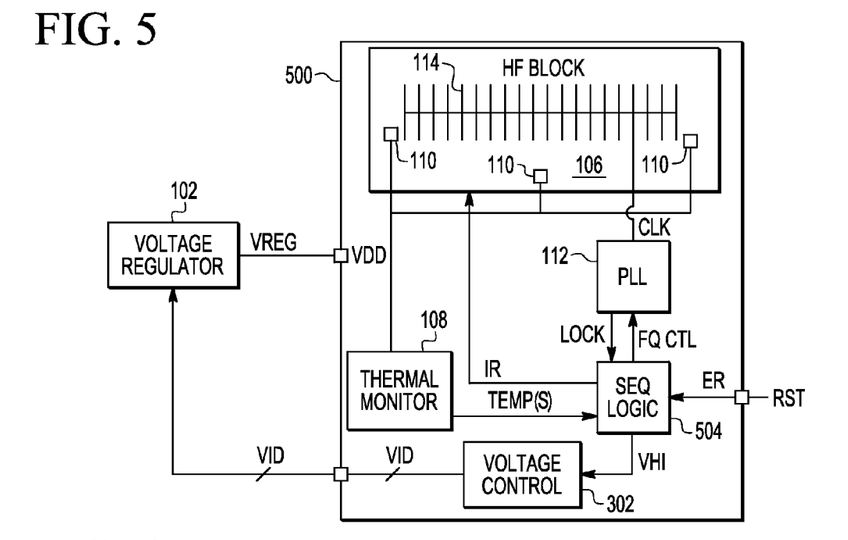
FIG. 5 is a simplified block diagram of a semiconductor device incorporating a cold start system and method for enabling maximum performance operation within an extended ambient temperature range according to one embodiment using any selected combination of elevated frequency and/or elevated supply voltage for heating the semiconductor device.

FIG. 5 is a simplified block diagram of a semiconductor device 500 incorporating a cold start system and method for enabling maximum performance operation within an extended ambient temperature range according to one embodiment. The semiconductor device 500 may also be implemented to perform any type of function, including processing functions such as including one or more processors, microcontrollers and/or microprocessors or the like, and also may be part of or incorporated within a system-on-chip (SOC) or as part of an embedded processing system or the like.

In this case, the semiconductor device 500 is substantially similar to the semiconductor device 100 and further includes additional functions of the semiconductor device 300. The semiconductor device 500 receives VREG from the voltage regulator 102 via VDD supply voltage pin, receives RST via ER pin, and includes the HF block 106, the thermal monitor 108, the temperature sensors 110, the PLL 112 providing CLK to the clock tree 114, and the voltage control block 302 providing VID to the voltage regulator 102. The sequence logic 104 is replaced by sequence logic 504, which incorporates combined functions of the sequence logic 104 and the sequence logic 304. The sequence logic 504 provides FQ CTL to the PLL 112, receives LOCK, receives ER and TEMP(S), and provides IR. The sequence logic 504 further provides the VHI override to the voltage control block 302.

Figure 6:
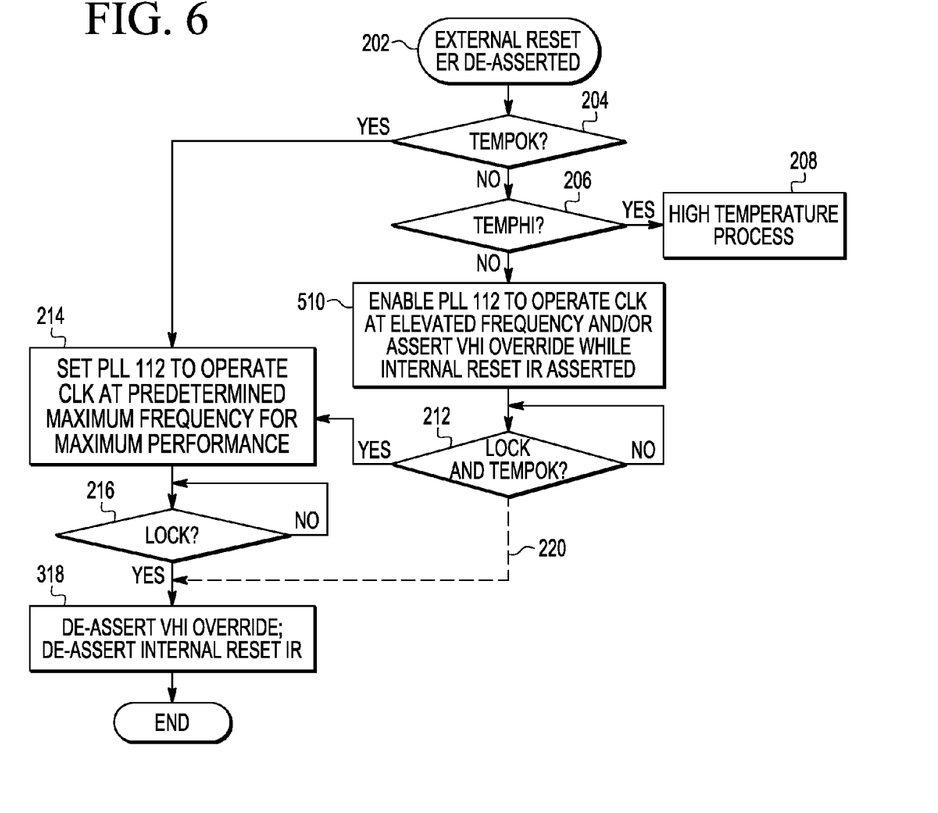
FIG. 6 is a flowchart diagram illustrating operation of the sequence logic of the semiconductor device of FIG. 5 according to one embodiment.

FIG. 6 is a flowchart diagram illustrating operation of the sequence logic 504 of the semiconductor device 500 according to one embodiment. Operational blocks 202, 204, 206 and 208 are included and are substantially the same and are not further described. When the temperature is too low as determined at block 206, operation advances to block 510 in which the sequence logic 504 enables or otherwise programs the PLL 112 to operate CLK at the elevated frequency and/or asserts the VHI override while the internal reset signal IR is asserted.

The term "and/or" in this case is intended to mean that either or both elevated voltage and elevated voltage techniques may be employed. Thus, in one case the frequency of CLK may be elevated while VHI is not asserted so that only high frequency heating is applied. Alternatively, VHI may be asserted while the frequency of CLK is not elevated for high voltage heating. Even for high voltage heating, the PLL 112 may still control the PLL 112 to set CLK at the predetermined maximum frequency for maximum performance rather than at a higher elevated frequency level. It may be advantageous to start CLK without delay or additional heating upon POR. Alternatively, both techniques of elevated frequency and elevated voltage may be simultaneously applied to maximize heat generation and minimize startup delay from the time RST is de-asserted.

Operation advances to block 212 to monitor LOCK and TEMPOK and when both are true, operation advances to block 214, in which the PLL 112 is set or programmed to operate CLK at a predetermined maximum frequency for achieving maximum performance in a similar manner as previously described. Operation then advances or loops at block 216 in a similar manner previously described. Operation then advances to block 318, in which VHI is de-asserted (if previously asserted) so that VREG is dropped to its normal operating level. Alternative path indicated by dashed line 220 denotes the alternative configuration for when the elevated frequency level and the predetermined maximum frequency for maximum performance are the same, in which case operation advances directly to block 318 from block 212 when LOCK and TEMP are true.

Figure 7:
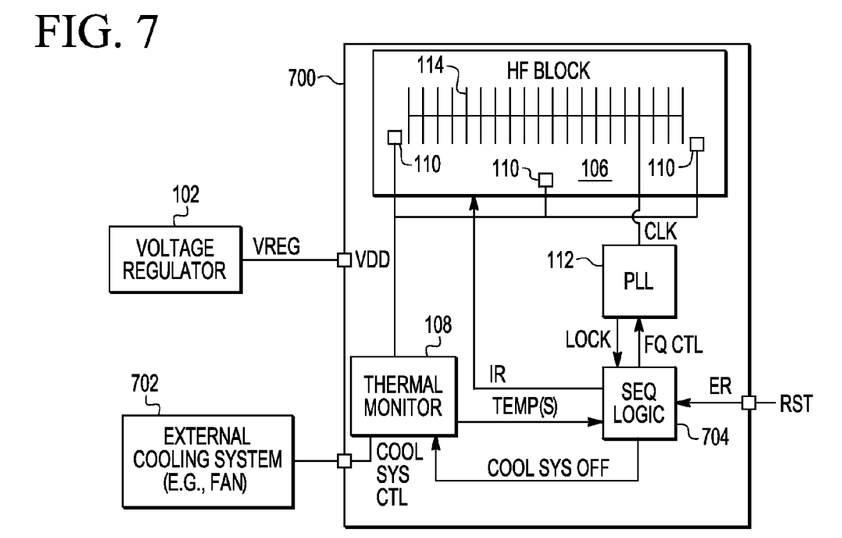
FIG. 7 is a simplified block diagram of a semiconductor device incorporating a cold start system and method for enabling maximum performance operation within an extended ambient temperature range according to one embodiment including controlling operation of an external cooling system during the heating process.

FIG. 7 is a simplified block diagram of a semiconductor device 700 incorporating a cold start system and method for enabling maximum performance operation within an extended ambient temperature range according to one embodiment. The semiconductor device 700 may also be implemented to perform any type of function, including processing functions such as including one or more processors, microcontrollers and/or microprocessors or the like, and also may be part of or incorporated within a system-on-chip (SOC) or as part of an embedded processing system or the like.

In this case, the semiconductor device 700 is substantially similar to the semiconductor device 100 and further includes an external cooling system 702. The cooling system 702 may be implemented in any suitable manner, such as a cooling fan or the like. The semiconductor device 700 receives VREG from the voltage regulator 102 via VDD supply voltage pin, receives RST via ER pin, and includes the HF block 106, the thermal monitor 108, the temperature sensors 110, and the PLL 112 providing CLK to the clock tree 114. The sequence logic 104 is replaced by sequence logic 704, which is similar to the sequence logic 104 except further including logic for asserting a COOL SYS OFF override signal. The sequence logic 704 provides FQ CTL to the PLL 112, receives LOCK, receives ER and TEMP(S), and provides IR. In this case, the thermal monitor 108 is coupled via a pin or the like to the external cooling system 702 and provides cooling system control (COOL SYS CTL). The cooling system control may be a simple on/off function, or alternatively the thermal monitor 108 may include logic for variable control. In alternative embodiments, other logic, such as the sequence logic 704 or other logic (not shown), may include the cooling system control logic rather than the thermal monitor 108.

Figure 8:
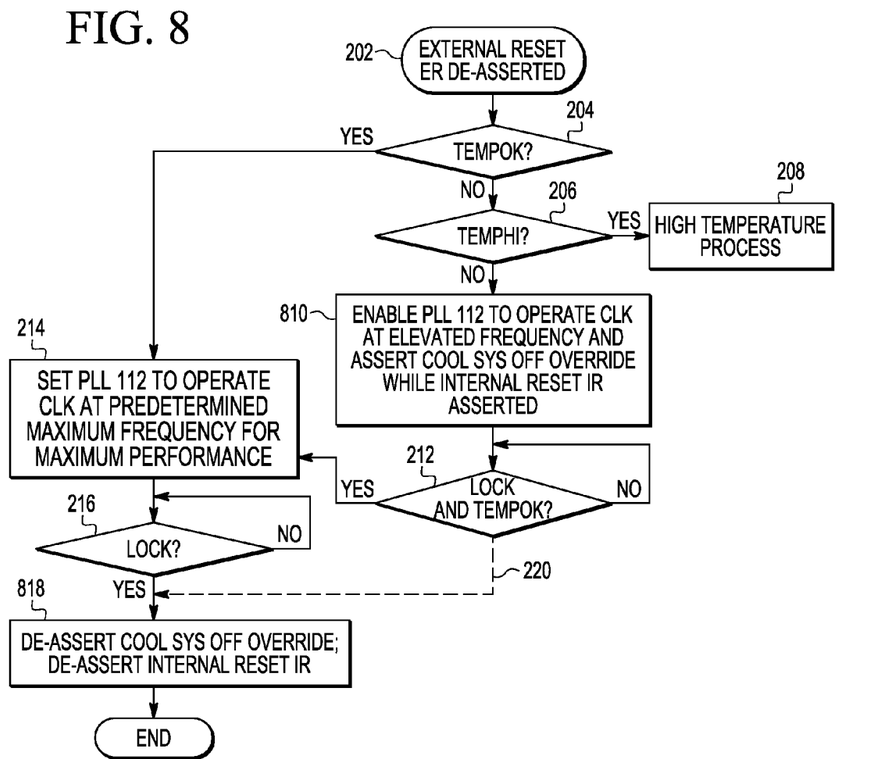
FIG. 8 is a flowchart diagram illustrating operation of the sequence logic of the semiconductor device of FIG. 7 according to one embodiment.

FIG. 8 is a flowchart diagram illustrating operation of the sequence logic 704 of the semiconductor device 700 according to one embodiment. Operational blocks 202, 204, 206 and 208 are included and are substantially the same and are not further described. When the temperature is too low as determined at block 206, operation advances to block 810 in which the sequence logic 704 enables or otherwise programs the PLL 112 to operate CLK at the elevated frequency and further asserts the COOL SYS OFF override while the internal reset signal IR is asserted.

In this case, the COOL SYS OFF override ensures that the external cooling system 702 is turned off during the POR process. Making sure that the external cooling system 702 is turned off during the POR process avoids the cooling effect which would otherwise counteract preliminary heating of the semiconductor device 700. Operation is otherwise substantially similar to that of the sequence logic 104, except that block 218 is replaced by block 818 which further includes de-asserting the COOL SYS OFF override signal after operating temperature has been reached. It is understood that given the low temperature, the external cooling system 702 may not be turned on anyway. If, however, the external cooling system 702 may be activated at a low speed or turned on for other reasons, the COOL SYS OFF override prevents counterproductive cooling operation during heating. As previously noted, the override is only temporary, such as lasting only a few milliseconds, so that shutting off the external cooling system 702 is otherwise inconsequential.

Figure 9:
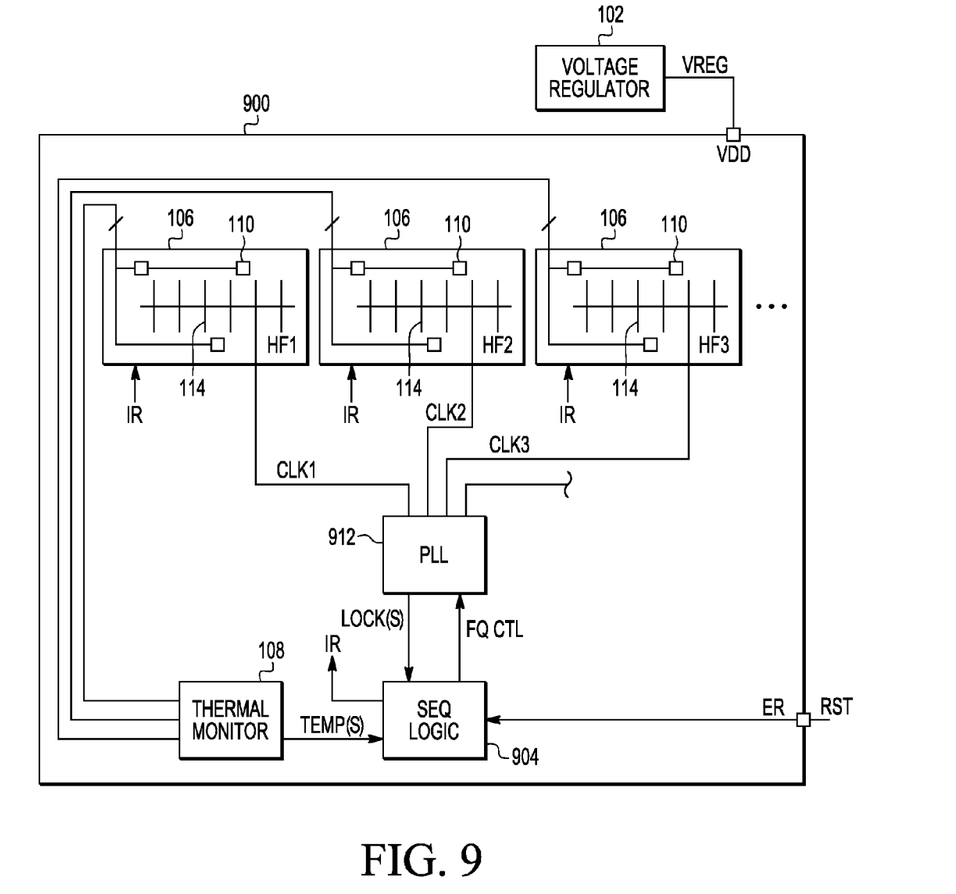
FIG. 9 is a simplified block diagram of a semiconductor device incorporating a cold start system and method for enabling maximum performance operation within an extended ambient temperature range according to one embodiment with multiple high frequency blocks and corresponding clock signals.

FIG. 9 is a simplified block diagram of a semiconductor device 900 incorporating a cold start system and method for enabling maximum performance operation within an extended ambient temperature range according to one embodiment. The semiconductor device 900 may also be implemented to perform any type of function, including processing functions such as including one or more processors, microcontrollers and/or microprocessors or the like, and also may be part of or incorporated within a system-on-chip (SOC) or as part of an embedded processing system or the like.

The semiconductor device 900 is substantially similar to any one of the semiconductor devices 100, 500 and 700 and includes similar functional components previously described. The semiconductor device 900 includes sequence logic 904 which may be implemented in a substantially similar manner as any of the of sequential logic blocks 104, 504 and 704 previously described. In this case, the semiconductor device 900 includes multiple high frequency blocks 106, individually labeled HF1, HF2, HF3, and so on. Any number of high frequency blocks 106 may be included, and each may be any one of processor cores, interconnects, memory caches, etc. Each high frequency block 106 includes one or more temperature sensors 110 in a similar manner previously described. The temperature sensors 110 are coupled to the thermal monitor 108 in a similar manner previously described. The PLL 112 is replaced by a PLL 912 which provides multiple clock signals CLK1, CL2, CLK3, etc., each distributed to the clock tree 114 of a corresponding one of the high frequency blocks 106.

The semiconductor device 900 illustrates that in any given configuration, more than one high frequency block may be included, each receiving a corresponding clock signal having the same or a different frequency. Thus, the clock signals CLK1, CL2, CLK3, etc., may have the same frequency or may have different clock frequencies. In this case, when RST is de-asserted and while IR remains asserted, the sequence logic 904 controls the PLL 912 to assert each of the clock signals CLK1, CL2, CLK3, etc., at an elevated frequency level.

Furthermore, the elevated frequencies may be the same or different. In either case, the temperature conditions of the high frequency blocks 106 may vary with respect to each other during the preliminary heating process. Also, the minimum operating temperature of the high frequency blocks 106 may vary with respect to each other, so that different blocks or portions of the semiconductor device 900 may be raised to the same or different predetermined minimum temperature levels when the reset condition is negated to initiate operation. For example, HF1 may have a minimum operating temperature of −5° C., HF2 may have a minimum operating temperature of −10° C., HF3 may have a minimum operating temperature of −0° C., and so on. The thermal monitor 108 may be configured to separately report the separate temperatures of the temperature sensors 110 and/or the separate temperature conditions of each of the high frequency blocks 106, where the sequence logic 904 is configured to determine when each of the high frequency blocks 106 has reached its minimum operating temperature before de-asserting IR.

In a simple processing configuration, the sequence logic 904 de-asserts IR when each temperature or temperature condition has reached a predetermined common minimum operating level that is suitable for each of the high frequency blocks 106 for achieving the maximum performance level of the semiconductor device 900.

A method of initializing operation of a semiconductor device according to one embodiment includes detecting de-assertion of an external reset signal while the semiconductor device in a reset state, monitoring a temperature level of the semiconductor device, and while the temperature level is below a predetermined minimum operating temperature level that allows the semiconductor device to operate at a maximum performance level, keeping the semiconductor device in the reset state and asserting at least one operating parameter on the semiconductor device at an elevated level to generate heat on the semiconductor device, and releasing the reset condition when the temperature level is at least the predetermined minimum operating temperature level.

Many electronic systems including an external cooling system, such as a fan or the like. The method may further include commanding that an external cooling system be turned off until the reset condition is released to avoid counterproductive cooling during the preliminary heating process.

A semiconductor device according to one embodiment includes a thermal monitor and sequence logic. The thermal monitor monitors a temperature of the semiconductor device and provides a temperature value indicative thereof. The sequence logic, in response to an external reset signal being de-asserted when the temperature value indicates that the temperature is below a predetermined minimum operating temperature level, commands at least one operating parameter of the semiconductor device to operate at an elevated level to generate heat on the semiconductor device while maintaining an internal reset state. The sequence logic releases the reset state to allow the semiconductor device to operate at a maximum performance level when the temperature value indicates that the temperature is at least the predetermined minimum operating temperature level.

As described herein, the operating parameter may be a frequency level of at least one clock signal or a supply voltage provided to the semiconductor device, or a combination of both. An elevated frequency level is sufficiently high such that the semiconductor device is unable to operate when its temperature is below the predetermined minimum operating temperature level. The elevated frequency level may be the same as a maximum frequency level that achieves the maximum performance level. An elevated voltage level may be as high as possible without being so high as to stress internal components or circuitry or otherwise to compromise components or cause damage. Using elevated frequency and/or voltage during the reset condition generates heat on the semiconductor device so that it can reach the predetermined minimum operating temperature level quickly to enable operations.

The elevated frequency may be provided to a high frequency block or the like including a clock tree the produces resistive heating when stimulated by the clock signal at the elevated frequency. Multiple high frequency blocks are contemplated, each receiving the same or a different clock signal at the same or at different frequencies depending upon the particular configuration. Each high frequency block may have the same or a different minimum operating temperature level suitable for enabling maximum performance operation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of initializing operation of a semiconductor device, comprising:
   detecting de-assertion of an external reset signal while the semiconductor device is in a reset condition;
   monitoring a temperature level of the semiconductor device;
   while the temperature level is below a predetermined minimum operating temperature level that allows the semiconductor device to operate at a maximum performance level,
   keeping the semiconductor device in the reset condition; and
   asserting a clock signal to a high frequency block incorporating at least one clock tree on the semiconductor device at an elevated frequency level to generate resistive heat on the semiconductor device while receiving the clock signal; and
   releasing the reset condition when the temperature level is at least the predetermined minimum operating temperature level.

2. The method of claim 1, wherein the clock signal is provided to a high frequency block of the semiconductor device that is unable to operate at the maximum performance level while the temperature level is below the predetermined minimum operating temperature level and the clock signal is at the elevated frequency level.

3. The method of claim 1, wherein said asserting a clock signal comprises asserting a clock signal at a maximum frequency level of a frequency generator of the semiconductor device.

4. The method of claim 1, further comprising commanding a supply voltage provided to the semiconductor device to be greater than a predetermined normal operating voltage level.

5. The method of claim 1, further comprising commanding a supply voltage provided to the semiconductor device to be asserted at a maximum voltage level tolerable by the semiconductor device.

6. The method of claim 1, wherein said monitoring a temperature level comprises measuring a plurality of temperatures at a plurality of locations on the semiconductor device, and wherein said releasing the reset condition comprises releasing the reset condition when a minimum one of the plurality of temperatures is at least the predetermined minimum operating temperature level.

7. The method of claim 1, wherein said monitoring a temperature level comprises measuring a plurality of temperature levels at a corresponding plurality of locations of the semiconductor device, wherein each of the plurality of locations of the semiconductor device has a corresponding one of a plurality of minimum operating temperature levels, and wherein said releasing the reset condition comprises releasing the reset condition when a temperature level of each of the plurality of locations has reached a corresponding one of the plurality of minimum operating temperature levels.

8. The method of claim 1, further comprising commanding that an external cooling system be turned off while the semiconductor device is in the reset condition.

9. A semiconductor device, comprising:
   a thermal monitor that monitors a temperature of the semiconductor device and that provides a temperature value indicative thereof;
   a frequency control block that asserts a clock signal;
   a high frequency block incorporating at least one clock tree that generates resistive heating while receiving said clock signal;
   sequence logic that, in response to an external reset signal being de-asserted when said temperature value indicates that the temperature is below a predetermined minimum operating temperature level, commands said frequency control block to assert said clock signal at an elevated frequency level to generate heat on the semiconductor device while maintaining an internal reset state; and
   wherein said sequence logic releases said reset state to allow the semiconductor device to operate at a maximum performance level when said temperature value indicates that the temperature is at least said predetermined minimum operating temperature level.

10. The semiconductor device of claim 9, wherein said clock signal is provided to a high frequency block of the semiconductor device that is unable to operate at said maximum performance level while the temperature is below said predetermined minimum operating temperature level and said clock signal is at the elevated frequency level.

11. The semiconductor device of claim 9, further comprising:
   a voltage control block that asserts a supply voltage request signal; and
   wherein said sequence logic commands said voltage control block to request a supply voltage provided to the semiconductor device to be at an elevated voltage level.

12. The semiconductor device of claim 9, wherein said thermal monitor controls operation of an external cooling system, and wherein said sequence logic further commands said thermal monitor to turn off said external cooling system while said temperature value indicates that the temperature is below a predetermined minimum operating temperature level.

13. A method of initializing operation of a semiconductor device, comprising:
   detecting de-assertion of an external reset signal while the semiconductor device is in a reset condition;
   monitoring a temperature level of the semiconductor device;
   while the temperature level is below a predetermined minimum operating temperature level that allows the semiconductor device to operate at a maximum performance level,
      keeping the semiconductor device in the reset condition;
      asserting a clock signal to a high frequency block incorporating at least one clock tree on the semiconductor device at an elevated frequency level to generate resistive heat on the semiconductor device while receiving the clock signal; and
      commanding a supply voltage provided to the semiconductor device to be greater than a predetermined normal operating voltage level to generate heat on the semiconductor device; and
   releasing the reset condition when the temperature level is at least the predetermined minimum operating temperature level.

* * * * *